United States Patent
Ray et al.

(10) Patent No.: US 10,008,273 B2
(45) Date of Patent: Jun. 26, 2018

(54) CELL CURRENT BASED BIT LINE VOLTAGE

(71) Applicant: SanDisk Technologies LLC, Plano, TX (US)

(72) Inventors: Biswajit Ray, Santa Clara, CA (US); Gerrit Jan Hemink, San Ramon, CA (US); Mohan Dunga, Santa Clara, CA (US); Bijesh Rajamohanan, Milpitas, CA (US); Changyuan Chen, San Ramon, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 33 days.

(21) Appl. No.: 15/181,346

(22) Filed: Jun. 13, 2016

(65) Prior Publication Data

US 2017/0358365 A1  Dec. 14, 2017

(51) Int. Cl.

| | |
|---|---|
| *G11C 16/28* | (2006.01) |
| *G06F 11/10* | (2006.01) |
| *G11C 29/52* | (2006.01) |
| *G11C 16/04* | (2006.01) |
| *G11C 16/24* | (2006.01) |
| *G11C 16/26* | (2006.01) |
| *G11C 29/02* | (2006.01) |
| *G11C 7/12* | (2006.01) |
| *G11C 29/12* | (2006.01) |

(52) U.S. Cl.
CPC .......... *G11C 16/28* (2013.01); *G06F 11/1068* (2013.01); *G11C 16/0483* (2013.01); *G11C 16/24* (2013.01); *G11C 16/26* (2013.01); *G11C 29/028* (2013.01); *G11C 29/52* (2013.01); *G11C 7/12* (2013.01); *G11C 2029/1204* (2013.01)

(58) Field of Classification Search
CPC ............ G06F 11/1048; G06F 11/1072; G06F 11/1068; G11C 29/42; G11C 11/5628; G11C 29/52; G11C 16/28
See application file for complete search history.

(56) References Cited

U.S. PATENT DOCUMENTS

| | | | | |
|---|---|---|---|---|
| 6,466,503 | B2 * | 10/2002 | Koizumi | G11C 17/12 |
| | | | | 365/207 |
| 2013/0033938 | A1 * | 2/2013 | Park | G11C 11/5628 |
| | | | | 365/185.22 |
| 2013/0198589 | A1 * | 8/2013 | Choi | G06F 11/1072 |
| | | | | 714/773 |
| 2014/0160845 | A1 * | 6/2014 | Ratnam | G11C 29/42 |
| | | | | 365/185.09 |
| 2016/0124805 | A1 * | 5/2016 | Lee | G06F 11/1048 |
| | | | | 714/6.11 |

* cited by examiner

*Primary Examiner* — Shelly A Chase
(74) *Attorney, Agent, or Firm* — Kunzler, PC

(57) ABSTRACT

Apparatuses, systems, methods, and computer program products are disclosed for read level determination. A block of non-volatile storage cells has a plurality of bit lines. A controller for a block is configured to perform a first read on a set of storage cells using a first read level for the bit lines. A controller is configured to determine a second read level for at least a portion of the bit lines based at least partially on a first read. A controller is configured to perform a second read on a set of storage cells using a second read level for at least a portion of bit lines.

20 Claims, 17 Drawing Sheets

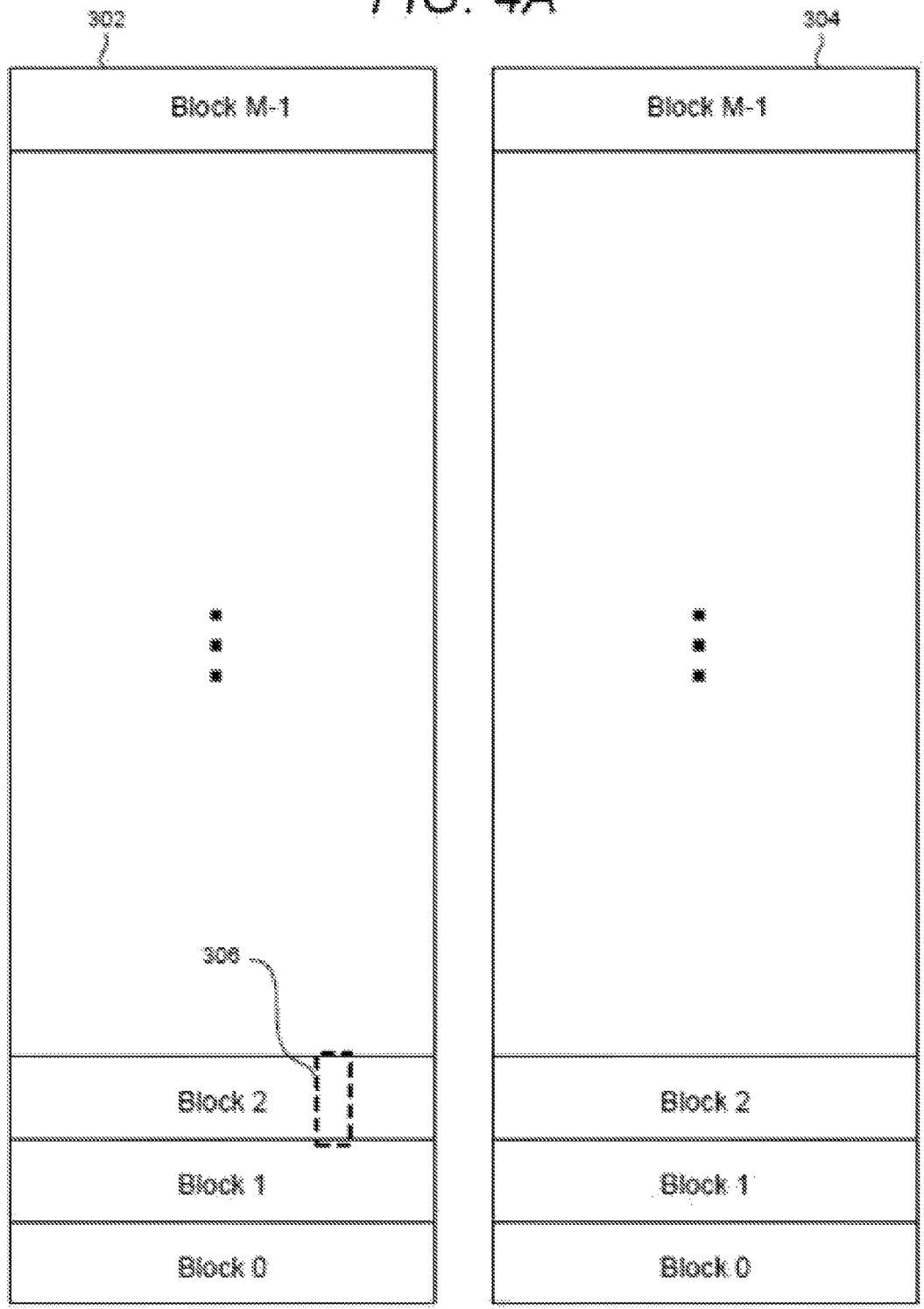

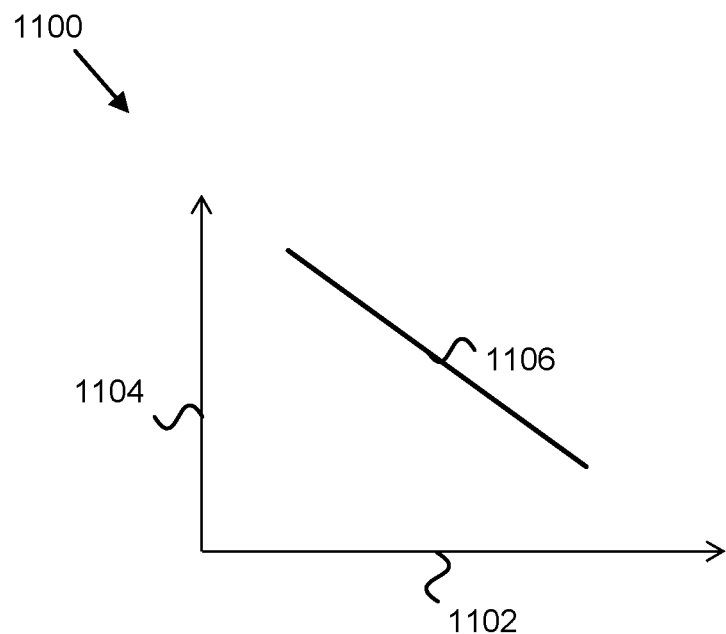
FIG. 11
 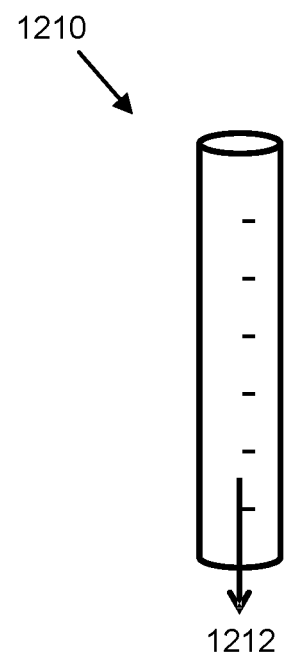
FIG. 12A	FIG. 12B

CELL CURRENT BASED BIT LINE VOLTAGE

TECHNICAL FIELD

The present disclosure, in various embodiments, relates to storage devices and more particularly relates to cell current based bit line voltages for storage devices.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, manufacturing differences, or the like. For example, a level for sensing a cell's state may vary between cells. As storage density increases, feature size shrinks, making the cells more susceptible to such differences.

SUMMARY

Apparatuses are presented for read level determination. In one embodiment, a block of non-volatile storage cells has a plurality of bit lines. A controller for a block, in certain embodiments, is configured to perform a first read on a set of storage cells using a first read level for the bit lines. A controller, in one embodiment, is configured to determine a second read level for at least a portion of bit lines based at least partially on a first read. In some embodiments, a controller is configured to perform a second read on a set of storage cells using a second read level for at least a portion of bit lines.

Methods are presented for read level determination. A method, in one embodiment, includes performing a dummy read on a memory cell. In another embodiment, a method includes determining a bit line input for a bit line of a memory cell based at least partially on a dummy read. A method, in certain embodiments, includes performing a read on a memory cell using a determined bit line input.

An apparatus for read level determination, in one embodiment, includes means for performing a first read on cells of a non-volatile memory medium to determine cell currents of the cells. In certain embodiments, an apparatus includes means for determining bit line voltages for a plurality of bit lines corresponding to cells based on a determined cell currents for the cells. In some embodiments, an apparatus includes means for performing a second read on cells using determined bit line voltages for a plurality of bit lines.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 4A is a block diagram illustrating one embodiment of a memory structure having two planes;

FIG. 11 is a graph illustrating one embodiment of an ON cell current compared to a bit line voltage;

FIG. 12A is a schematic block diagram illustrating one embodiment of a memory hole; and FIG. 12B is a schematic block diagram illustrating another embodiment of a memory hole.

DETAILED DESCRIPTION

Figure 1A:
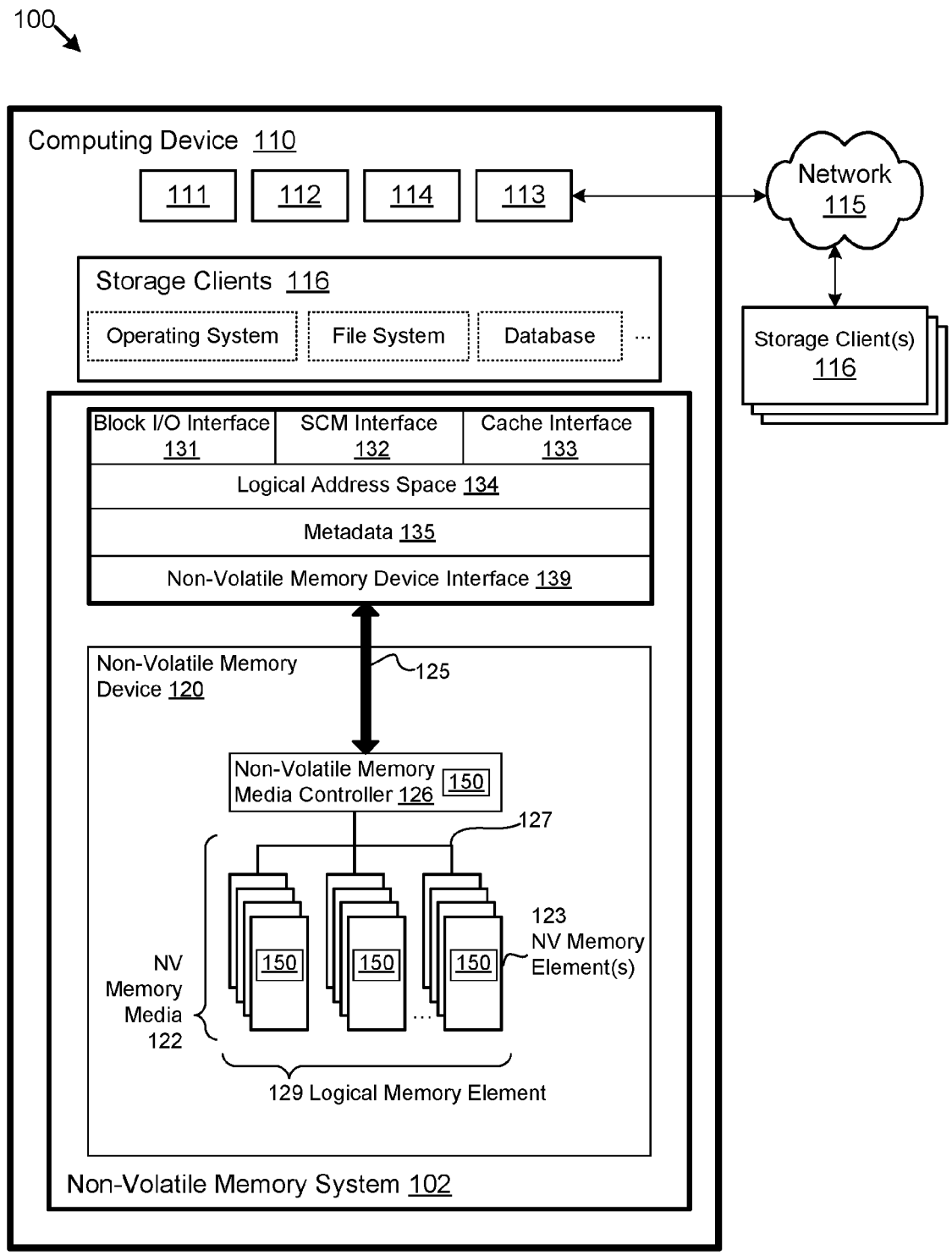
FIG. 1A is a schematic block diagram illustrating one embodiment of a system for read level determination.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures Like numbers may refer to like elements in the figures, including alternate embodiments of like elements.

FIG. 1A is a block diagram of one embodiment of a system 100 comprising a read level determination component 150 for a non-volatile memory device 120. The read level determination component 150 may be part of and/or in communication with a non-volatile memory media controller 126, a non-volatile memory element 123, a device driver, or the like. The read level determination component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the read level determination component 150 may be embodied as one or more computer readable instructions stored on the non-transitory storage medium 114.

The non-volatile memory system 102, in the depicted embodiment, includes a read level determination component 150. The read level determination component 150, in one embodiment, is configured to manage a sequence of reading data for the non-volatile memory device 120 described below. The read level determination component 150, in certain embodiments, may perform a first read on a set of storage cells of a bit line using a first read level. The read level determination component 150 may also determine a second read level for the bit line based at least partially on the first read. The read level determination component 150 may perform a second read on the set of storage cells using the second read level.

In one embodiment, the read level determination component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the read level determination component 150 may comprise executable software code, such as a device driver or the like, stored on the computer readable storage medium 114 for execution on the processor 111. In a further embodiment, the read level determination component 150 may include a combination of both executable software code and logic hardware.

In one embodiment, the read level determination component 150 is configured to receive storage requests from a device driver or other executable application via a bus 125 or the like. The read level determination component 150 may be further configured to transfer data to/from a device driver and/or storage clients 116 via the bus 125. Accordingly, the read level determination component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the read level determination component 150 may receive storage requests as an API call from a storage client 116, as an IO-CTL command, or the like.

According to various embodiments, a non-volatile memory controller 126 in communication with one or more program sequencing components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, ... WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device 110 interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
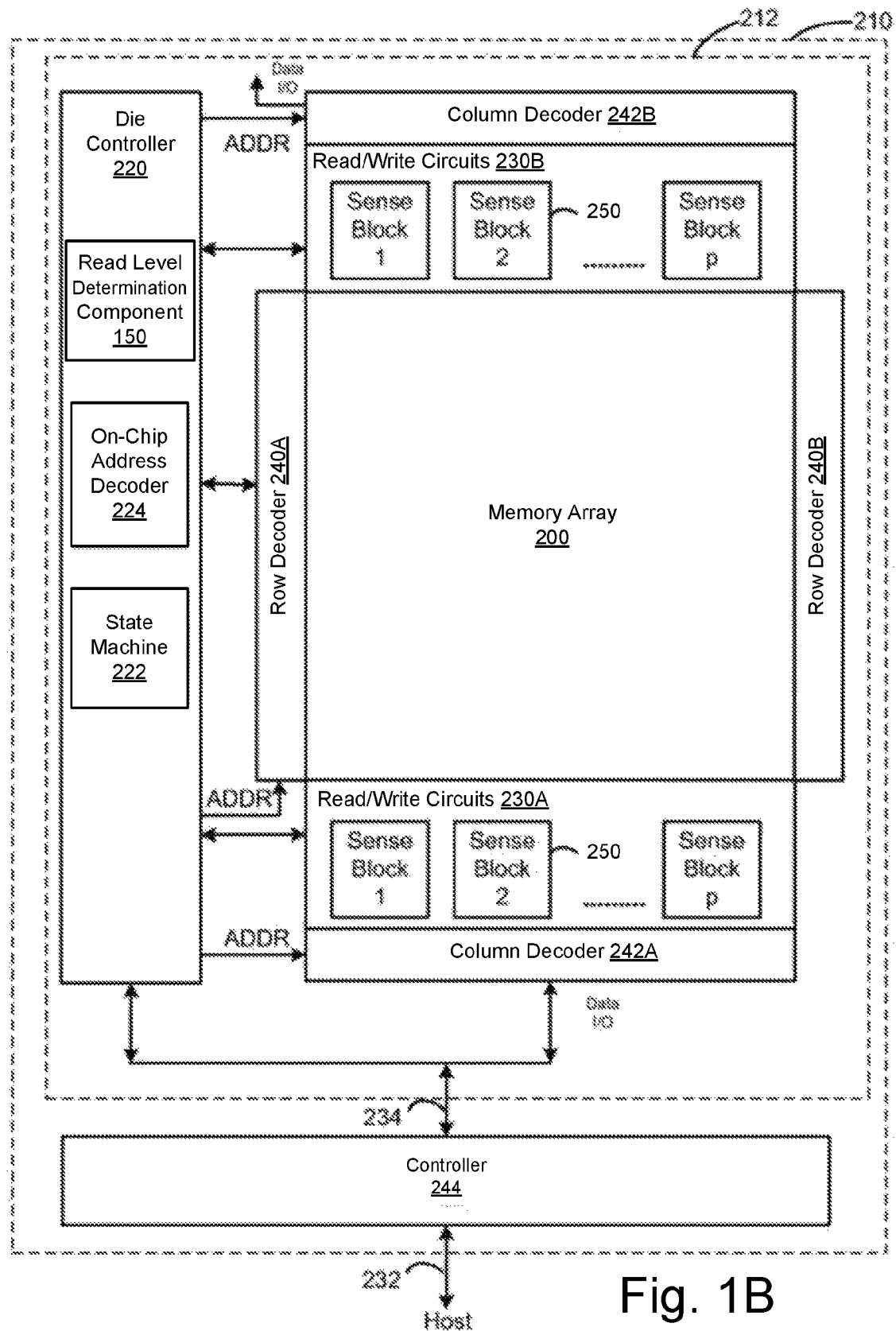
FIG. 1B is a schematic block diagram illustrating another embodiment of a system for read level determination.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a read level determination component 150, a state machine 222, and an on-chip address decoder 224. In one embodiment, the state machine 222 comprises at least a portion of the read level determination component 150. In a further embodiment, the controller 244 comprises at least a portion of the read level determination component 150.

The read level determination component 150, in one embodiment, is configured to perform a dummy read on a selected memory cell or multiple memory cells in a NAND string, determine a bit line input for a bit line associated with the selected memory cell or multiple memory cells in a NAND string based at least partially on the dummy read, and perform a read on the selected memory cell using the determined bit line input.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the read level determination component 150. The read level determination component 150, in some embodiments, determines a bit line read level for a bit line of a memory cell based on a prior read of the memory cell in order to perform a read on the memory cell. The read level determination component 150, in certain embodiments, is embodied as software in a device driver, hardware in a device controller 244, and/or hardware in a die controller 220 and/or state machine 222.

In one embodiment, one or any combination of die controller 220, read level determination component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
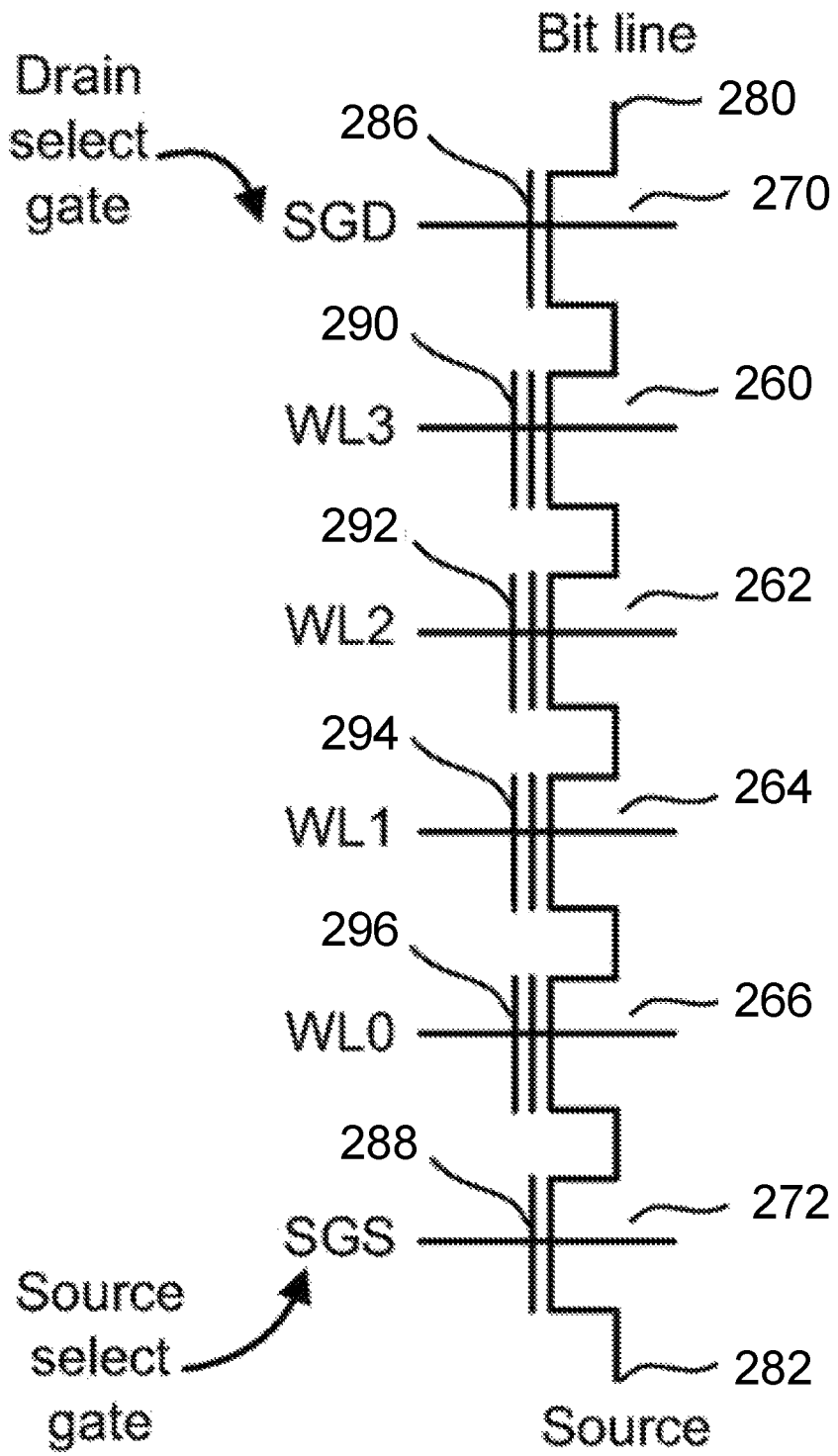
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the read level determination component 150 determines a read level or input (e.g., read voltage, read current) used for reading the storage elements 260, 262, 264, 266. The read level or input may depend on an "ON" current of one or more of the storage elements 260, 262, 264, 266 and may be selected to result in a number of errors that is less than a predetermined threshold. The read level determination component 150, in some embodiments, may determine the read level based on a prior or dummy read. In a further embodiment, the read level determination component 150 performs a read on storage elements 260, 262, 264, 266 by applying the read level to the bit line 280.

Figure 3:
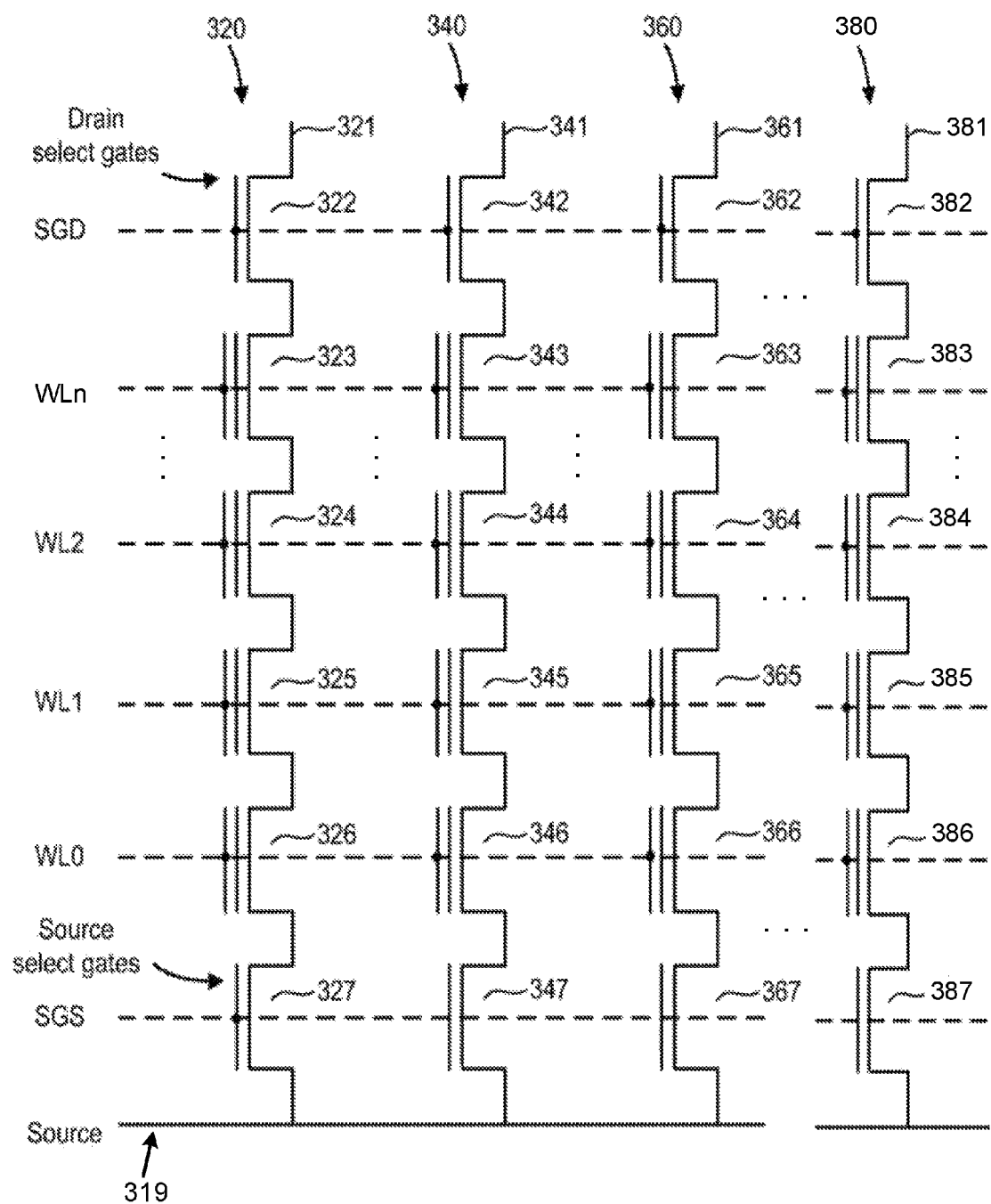
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, when a read operation is performed, a read error may occur on one or more storage elements 323-326, 343-346, 363-366, 383-386, which may be a result of an insufficient cell current provided by the one or more storage elements 323-326, 343-346, 363-366, 383-386 (e.g., an "ON" cell current flowing through the floating gate transistor over the bit line during a read operation, or the like). For example, an ON current for different storage elements 323-326, 343-346, 363-366, 383-386 storing the same data may vary, causing read errors. In such an embodiment, the read level determination component 150 may adjust a read level, such as a bias voltage of a bit line, applied to the one or more storage elements 323-326, 343-346, 363-366, 383-386 to reduce a number of read errors by compensating for the low cell current from one or more of the storage elements 323-326, 343-346, 363-366, 383-386.

FIG. 4A is a block diagram explaining one example organization of the non-volatile memory media 122, which is divided into two planes 302 and 304. Each plane is divided into M blocks. In one example, each plane has about 2000 blocks. However, different numbers of blocks and planes may also be used. For example, some non-volatile memory media 122 may have more than two planes. Other non-volatile memory media 122 may only have one plane. The M blocks may be divided into one or more portions 306.

Figure 4B:
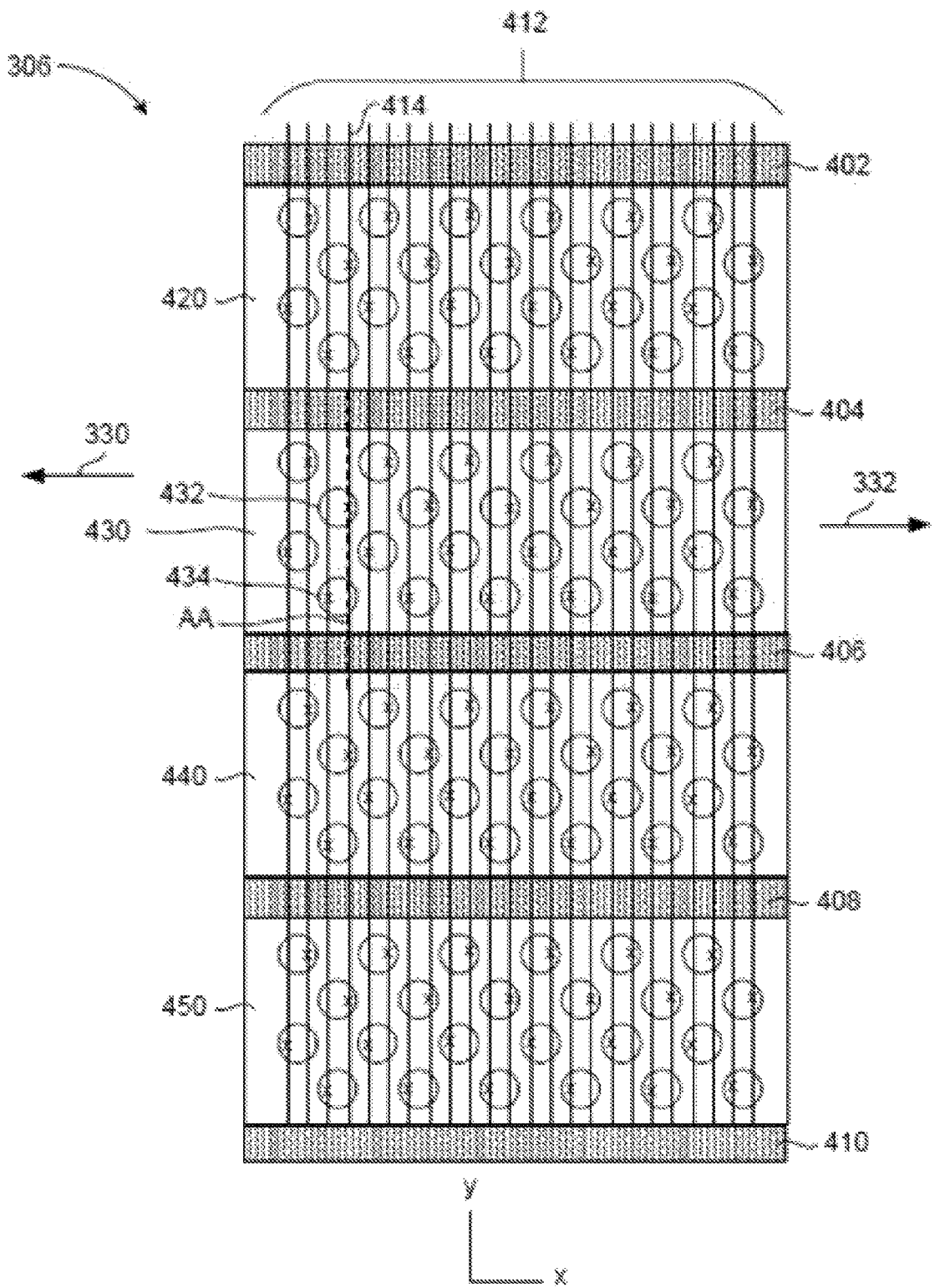
FIG. 4B illustrates one embodiment of a top view of a portion of a block of memory cells.

FIGS. 4B-4E depict an example 3D NAND structure. FIG. 4B is a block diagram depicting a top view of a portion of one block from the non-volatile memory media 122. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array may have 60 layers. Other embodiments may have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B.

FIG. 4B also depicts a set of bit lines 412. FIG. 4B shows twenty-four bit lines because only a portion of the block is depicted. It is contemplated that more than twenty-four bit lines are connected to vertical columns of the block. Each of the circles representing vertical columns has an "x" to indicate its connection to one bit line.

The block depicted in FIG. 4B includes a set of local interconnects 402, 404, 406, 408, and 410 that connect the various layers to a source line below the vertical columns. Local interconnects 402, 404, 406, 408, and 410 also serve to divide each layer of the block into four regions; for example, the top layer depicted in FIG. 4B is divided into regions 420, 430, 440, and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440, and 450. In that implementation, each block has sixteen rows of active columns and each bit line connects to four rows in each block. In one embodiment, all of four rows connected to a common bit line are connected to the same word line (via different word line fingers on the same level that are connected together); therefore, the non-volatile memory media 122 uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
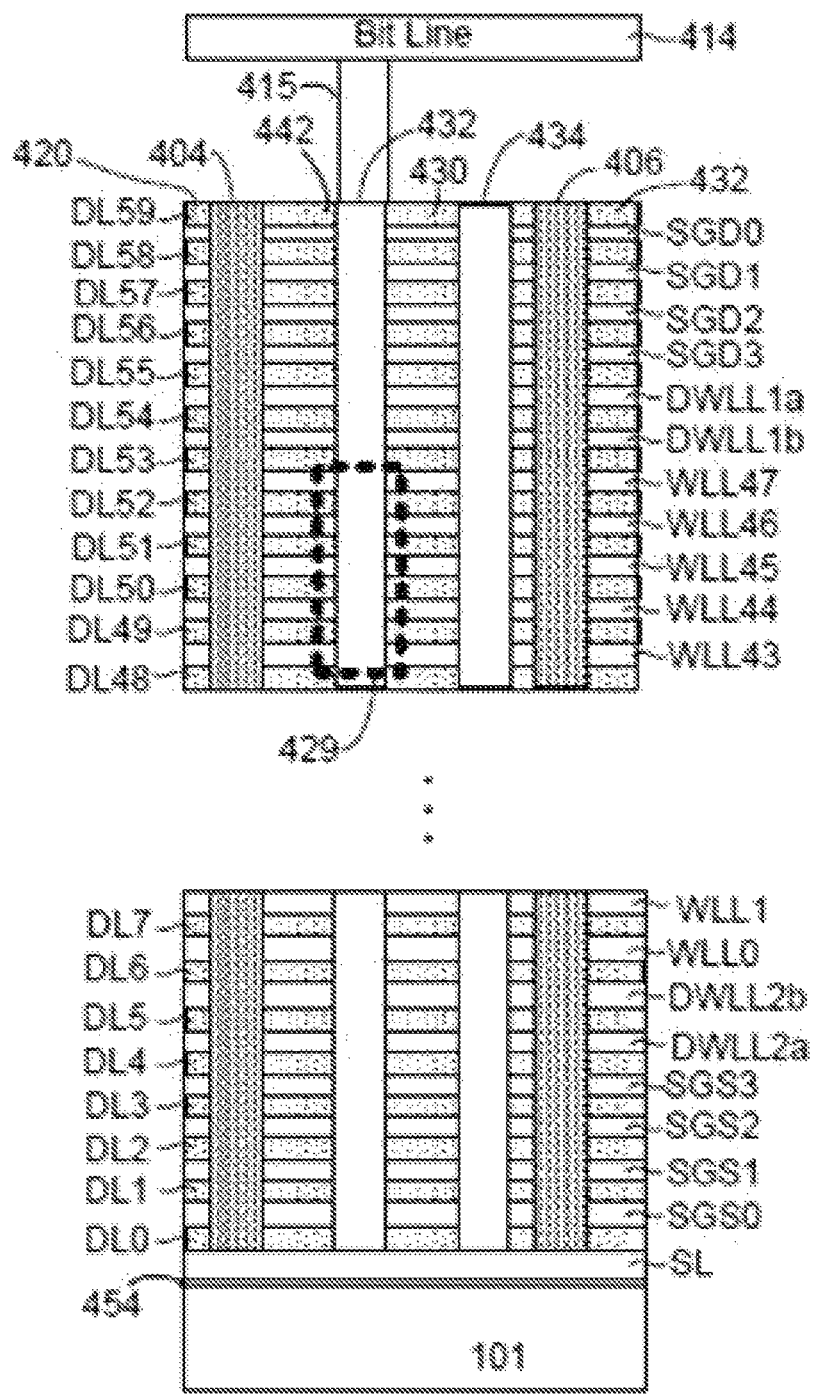
FIG. 4C illustrates one embodiment of a cross-sectional view of a portion of a block of memory cells.

FIG. 4C depicts a portion of an embodiment of the non-volatile memory media 122 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2, and SGD3; four source side select layers SGS0, SGS1, SGS2, and SGS3; four dummy word line layers DWLL1a, DWLL1b, DWLL2a, and DWLL2b; and forty-eight data word line layers WLL0-WLL47 for connecting to data memory cells. Other embodiments can implement more or less than four drain side select layers, more or less than four source side select layers, more or less than four dummy word line layers, and more or less than forty-eight word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is a substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2, and SGD3; source side select layers SGS0, SGS1, SGS2, and SGS3; dummy word line layers DWLL1a, DWLL1b, DWLL2a, and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten, or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO2. In other embodiments, other dielectric materials may be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a, and DWLL2b connect to dummy memory cells. A dummy memory cell does not store user data, while a data memory cell is eligible to store user data. Drain side select layers SGD0, SGD1, SGD2, and SGD3 are used to electrically connect and disconnect NAND strings from bit lines. Source side select layers SGS0, SGS1, SGS2, and SGS3 are used to electrically connect and disconnect NAND strings from the source line SL.

Figure 4D:
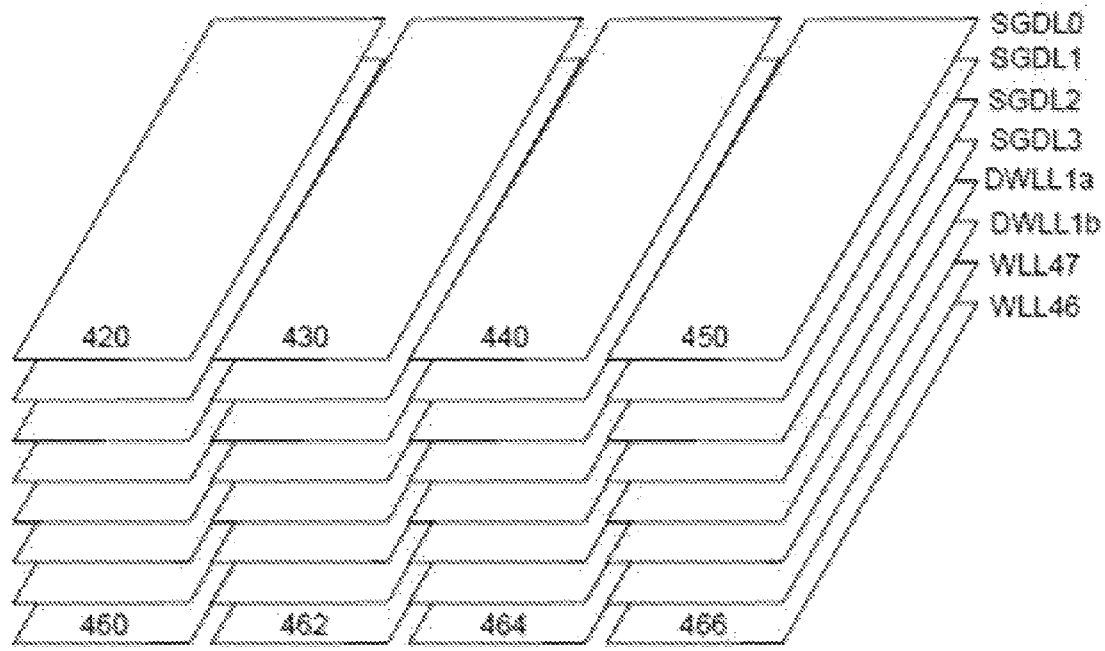
FIG. 4D illustrates one embodiment of a view of the select gate layers and word line layers.
Figure 4D:
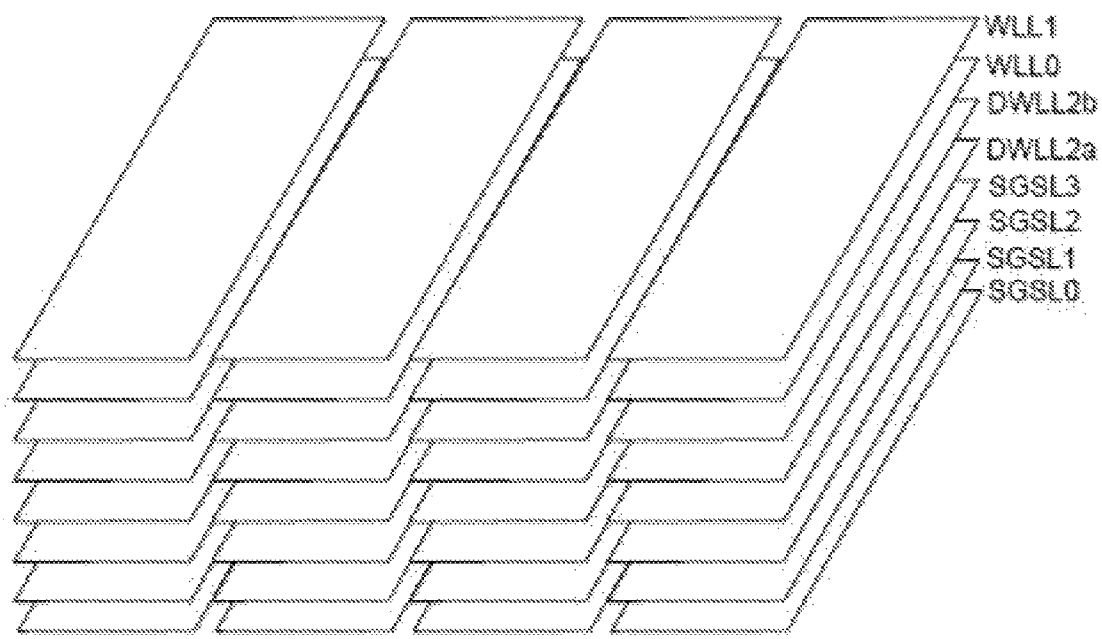

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408, and 410 break up each conductive layers into four regions. For example, word line layer WLL31 is divided into regions 460, 462, 464, and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
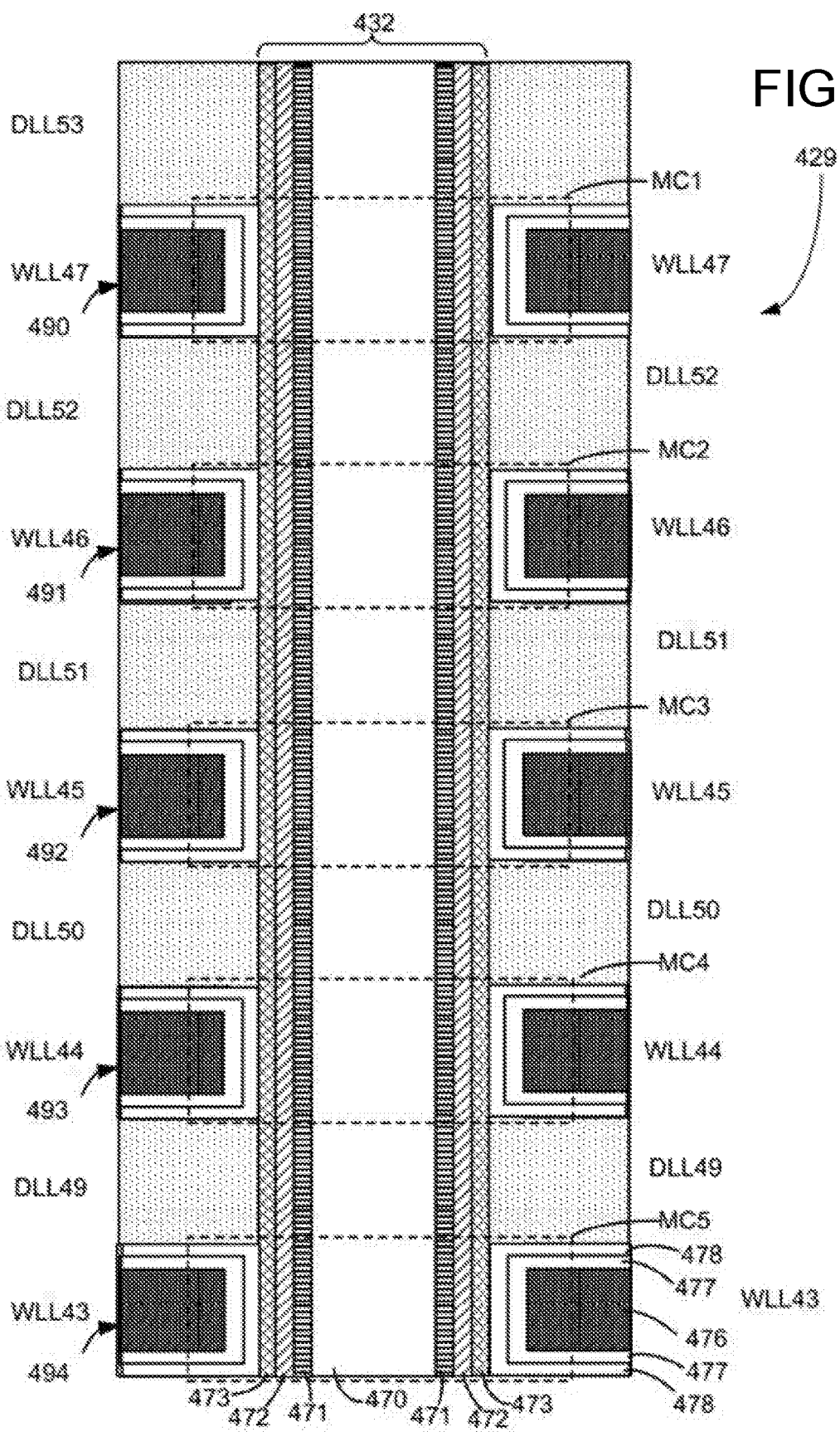
FIG. 4E illustrates one embodiment of a cross-sectional view of a vertical column of memory cells.

FIG. 4E illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
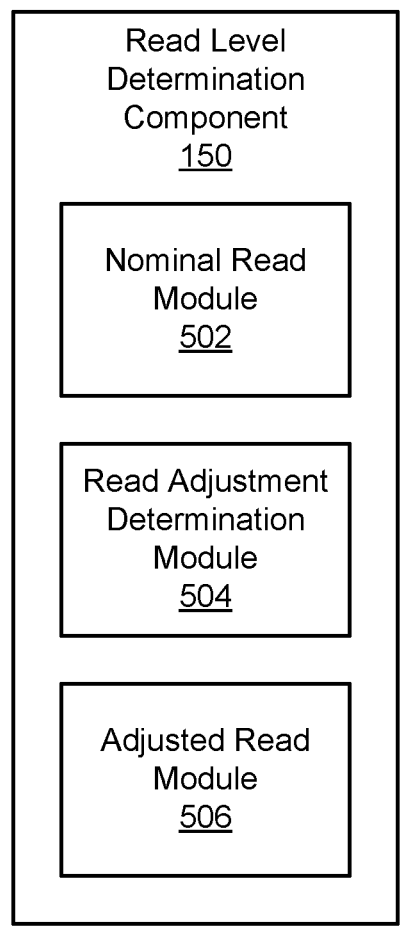
FIG. 5 is a schematic block diagram illustrating one embodiment of a read level determination component.

FIG. 5 depicts one embodiment of a read level determination component 150. The read level determination component 150 may be substantially similar to the read level determination component 150 described above with regard to FIGS. 1A, 1B, 2, and/or 3. In general, as described above, the read level determination component 150 determines a bit line input for a bit line associated with a memory cell or multiple memory cells in the same NAND string, based on a prior read of the memory cell or multiple memory cells in the same NAND string, and performs a read on the memory cell or multiple memory cells in a NAND string, using the determined bit line input. In the depicted embodiment, the read level determination component 150 includes a nominal read module 502, a read adjustment determination module 504, and an adjusted read module 506.

In various embodiments, the nominal read module 502 may perform a first read (e.g., nominal read, dummy read) on one or more storage cells of a word line, or one or more NAND strings associated with the same word line, using a first read level (e.g., a bit line voltage). The nominal read module 502, in certain embodiments, uses the same first read level for each bit line during the first read. The nominal read module 502, in certain embodiments, may perform multiple reads, at least one read for each word line of an erase block, or the like, in order to determine which storage cells of the erase block have low ON cell currents. In a further embodiment, the nominal read module 502 may perform reads for a subset of the word lines of an erase block (e.g., one word line, two word lines, five word lines, ten word lines, or the like), results of which may be representative of other word lines of the erase block. In another embodiment, two or more word lines of the same block are selected for the nominal read, reading two or more memory cells at the same time, in order to identify the NAND strings that have a low ON current.

A dummy read or nominal read, as used herein, may comprise a read operation for which the resulting data is not provided to a requesting storage client. The first read level may be, in certain embodiments, a bit line voltage or another read voltage, a read current, a sense time, and/or some other level or input used to read information stored on the one or more storage cells. In various embodiments, the first read level may be a nominal or default read level, a minimum read level, and/or a maximum read level. In one embodiment, the first read is performed during a manufacturing and/or testing process for the one or more storage cells. For example, the first read or set of reads may be performed during a die sort process or the like. Instead of detecting only high or low ON current, in some embodiments it is possible to distinguish multiple levels of ON current.

In one embodiment, the nominal read module 502 performs the first read using a read voltage threshold applied to the word line that is above the threshold voltages (e.g., stored charge levels) of the storage cells of the word line being read, so that the cells are each conductive and the ON currents of the cells can be determined on the associated bit lines. For example, the nominal read module 502 may read a word line in an erase state, may read a word line programmed with known data (e.g., a predetermined data pattern, the same storage state or abode for each storage cell, or the like). In a further embodiment, the nominal read module 502 may perform the first read on existing user data or workload data stored by cells of a word line, using a read voltage threshold sufficient to cause each of the cells to conduct.

In certain embodiments, results from the first read (e.g., cell currents, whether cell currents are above or below a threshold, determined read levels such as bit line voltages, the data that was read, or the like) may be stored within the one or more storage cells (e.g., a dedicated one or more word lines in each erase block or the like may store a direct or indirect result from the first read). For example, in response to the first read completing, information corresponding to the first read may be stored. In one embodiment, information corresponding to a first read may be stored using one or more data latches or registers of the non-volatile memory device 120. In another embodiment, in each erase block of non-volatile storage cells, one or more dedicated word lines may store data corresponding to results from the first read, such as which storage cells or multiple storage cells on the same NAND string and/or bit lines had ON cell currents below a threshold, which storage cells and/or bit lines the read adjustment determination module 504 described below selected for a higher bit line input (e.g., bit line voltage) during read operations, or the like. Instead of detecting only high or low ON current, in some embodiments it is possible to distinguish multiple levels of ON current and apply multiple levels of correction (e.g., bit line voltages) during read operations.

As described below, in certain embodiments, the same determined bit line inputs (e.g., bit line voltages) may be used for reads from any word line of an erase block (e.g., to conserve storage capacity used to save metadata indicating which bit lines have been selected for the determined bit line inputs). In a further embodiment, the same bit line may receive different bit line inputs for reads of different word lines (e.g., the read adjustment determination module 504 may make bit line input determinations for each storage cell of different word lines, metadata may be stored for different storage cells of different word lines, or the like). The metadata may store any type of information corresponding to an ON current of one or more storage cells. For example, the metadata may store digital data and/or analog data corresponding to one or more ON currents. In one embodiment, the metadata may store one of two, three, four, or more ON currents.

In one embodiment, the nominal read module 502 may provide data from a first nominal and/or dummy read to an error correcting code (ECC) decoder (e.g., of a controller 126 such as an FPGA, ASIC, device driver, or the like). The ECC decoder of a controller 126 may use the data from the first nominal/dummy read to correct one or more errors in data of a subsequent, second read, or the like. For example, the ECC decoder may comprise a low-density parity-check (LDPC) code decoder or other soft decision decoder configured to use the data from a first nominal and/or dummy read as soft decision information to assist in decoding and correcting one or more errors in a subsequent read of the same data, in addition to using the first nominal and/or dummy read to determine a read level for the subsequent read as described below.

In one embodiment, the read adjustment determination module 504 determines a second read level (e.g., bit line voltage or other read voltage, another bit line input, read current, sense time) for bit lines of one or more storage cells based at least partially on the first read performed by the nominal read module 502. In certain embodiments, the read adjustment determination module 504 determines the second read level by determining a number of failed storage cells of a set of storage cells with cell currents that fail to satisfy a sensing or detection threshold during the first read, determining whether the number of failed storage cells exceeds a predetermined threshold, and selecting the second read level based on whether the number of failed storage cells exceeds the predetermined threshold. For example, the read adjustment determination module 504 may make a determination based on reads of each word line of an erase block, and may determine bit line inputs to be used for the different bit lines regardless of which word line is being read, based on how many storage cells connected to the bit line have low ON cell currents. In other embodiments, the read adjustment determination module 504 may determine a different set of bit line inputs for each word line, so that each storage cell with a low ON cell current receives an adjusted (e.g., higher) bit line voltage during a read, even if other storage cells on the same bit line do not have a low ON cell current and do not receive an adjusted bit line voltage when their word lines are read.

In certain embodiments, a failed storage cell does not imply that the storage cell is necessarily in error, defective, and/or damaged, but that the ON cell current of the storage cell is lower than an expected level, a predetermined threshold, or the like. In other embodiments, a failed storage cell may be in error, defective, and/or damaged, causing the ON cell current of the storage cell to be lower than an expected level, or the like.

In various embodiments, the second read level may be greater than the first read level if the number of failed storage cells exceeds the predetermined threshold. In one embodiment, selecting the bit line input includes selecting a first bit line input for bit lines of a plurality of bit lines that do not exceed the predetermined threshold (e.g., selecting a higher than nominal or default bit line voltage, or the like), and selecting a second bit line input for bit lines of the plurality of bit lines that exceed the predetermined threshold (e.g., selecting a nominal and/or default bit line voltage, or the like). In such an embodiment, the first bit line input may be a bit line input used during the first read (e.g., a bit line voltage or bias). In some embodiments, the read adjustment determination module 504 determines the second read level for a plurality of bit lines corresponding to a plurality of memory cells. In this manner, in one embodiment, the adjusted read module 506 described below may dynamically use different bit line voltages or biases for different cells of the same word line during a read operation, using a higher bit line voltage for storage cells with lower ON cell currents to increase the ON cell currents thereby reducing data errors. In various embodiments, the determined second read level is stored in a non-volatile memory medium that includes a memory cell to be read.

As used herein, a bit line input may be a voltage, a current, and/or another input for a bit line of one or more storage cells, based on an architecture (e.g., NAND flash or other charge trapping storage, resistive storage such as ReRAM or Memristor memory, or the like) of cells, based on an operation being performed (e.g., read, erase, program, or the like), and/or on another factor. A bit line input may be applied to a bit line of one or more storage cells during a read operation, to bias the bit line to a certain level. For example, for NAND flash and/or another charge trapping storage technology, a read operation may use a parasitic capacitance of the bit line as part of a read operation by pre-charging the bit line to a bit line voltage. A nominal or default bit line voltage for a read operation, in one embodiment, may be about 0.2 volts, about 0.5 volts, about 1.0 volts, and/or another predefined voltage level.

During the read operation, if the storage cell is erased or has a stored threshold voltage below a read voltage threshold applied to the word line (e.g., to the control gate of the storage cell), in certain embodiments, the storage cell sinks current and discharges the bit line (e.g., an erased cell has a negative threshold voltage). If the storage cell is programmed (e.g., has a stored threshold voltage above a read voltage threshold applied to the word line), it does not sink current and the bit line keeps its pre-charged, biased value. Sense amplifiers 250 may sense currents of bit lines (e.g., whether or not the cell is sinking current) for a selected word line of storage cells to determine the stored data values of the word line. If a storage cell's ON current is too low, due to a defect, error, or the like, a sense amplifier 250 may not properly detect it, causing a data error.

In certain embodiments, the read adjustment determination module 504 determines the second read level (e.g., a bit line voltage) as a function of temperature of a memory device that includes storage cells. Such determination based on temperature may be made in addition to being based on the first read. In some embodiments, the second read level may include a higher read voltage than used by the first read level in response to a low temperature. In various embodiments, the second read level may include a lower read voltage than used by the first read level in response to a high temperature. In certain embodiments, any read level may be adjusted based on the temperature. For example, in one embodiment, the read adjustment determination module 504 may determine a first read level for a first set of bit lines and a second read level for a second set of bit lines. The read adjustment determination module 504 may adjust the first read level and/or the second read level based on a measured temperature of the memory device that includes the first and second sets of bit lines.

In some embodiments, the adjusted read module 506 performs a second read on the one or more storage cells using the second read level determined by the read adjustment determination module 504. In certain embodiments, the adjusted read module 506 performs the second read on a plurality of memory cells using the determined second read level for a plurality of bit lines. In various embodiments, the nominal read module 502 performs the first read using a first bit line input and the adjusted read module 506 performs the second read using a second bit line input. In such embodiments, the first bit line input may be less than the second bit line input in response to a cell current for a storage cell during the first read failing to satisfy a sensing or detection threshold. In certain embodiments, the first read is performed before the second read. In certain embodiments, the adjusted read module 506 uses both the first read level and the second read level for the second read, for different subsets of storage cells. For example, the adjusted read module 506 may use a first read level comprising a nominal/default bit line voltage bias for storage cells of a word line with detected ON cell currents above a threshold and may use a second read level comprising a higher bit line voltage for other storage cells of the word line with detected ON cell currents below the threshold, or the like.

Figure 6:
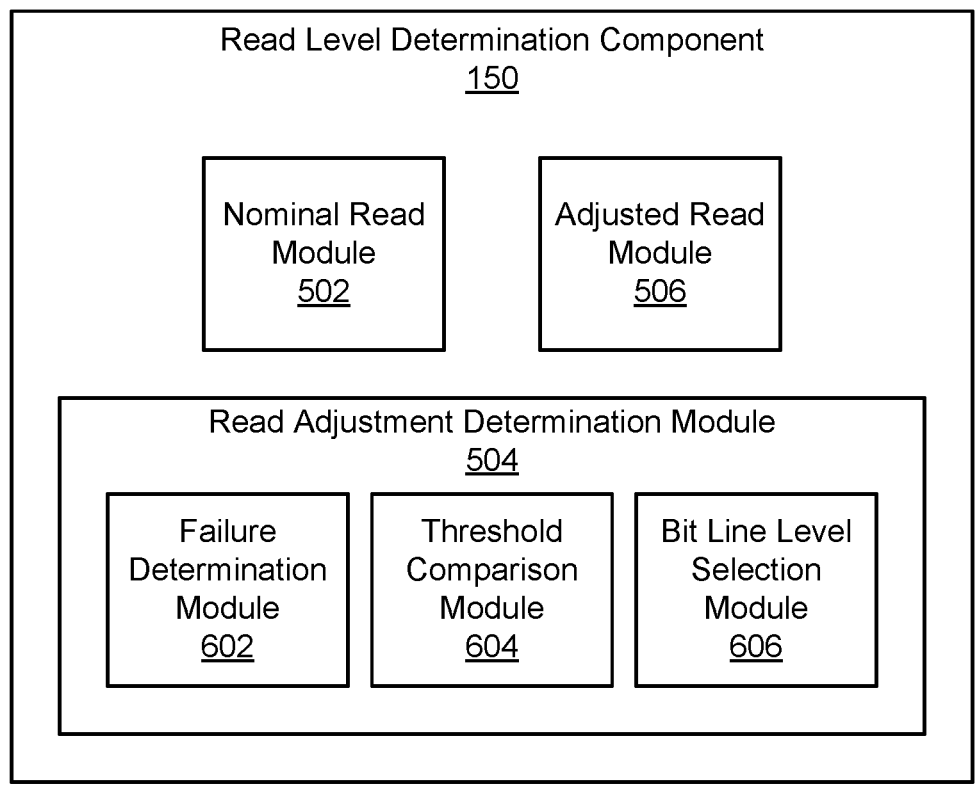
FIG. 6 is a schematic block diagram illustrating a further embodiment of a read level determination component.

FIG. 6 depicts a further embodiment of a read level determination component 150. The read level determination component 150 may be substantially similar to the read level determination component 150 described above with regard to FIGS. 1A, 1B, 2, 3, and/or 5. In the depicted embodiment, the read level determination component 150 includes the nominal read module 502, the read adjustment determination module 504, and the adjusted read module 506 and further includes a failure determination module 602, a threshold comparison module 604, and a bit line level selection module 606.

In one embodiment, the failure determination module 602 determines a number of failed storage cells of a set of storage cells with cell currents that fail to satisfy a sensing or detection threshold during a read. In some embodiments, the set of storage cells corresponds to storage cells connected to a single word line. As described above, failed storage cells may refer to storage cells with ON cell currents that are not detected and/or that are below a threshold during a first read operation completed using the first read level. A failed storage cell, in certain embodiments, as described above, does not imply that the storage cell is necessarily in error, defective, and/or damaged, but that the ON cell current of the storage cell is lower than an expected level, a predetermined threshold, or the like.

For example, in one embodiment, a first read may be performed on storage cells (e.g., a word line) by applying a first read level (e.g., a first nominal or default bit line voltage of about 0.35 volts or the like) to each bit line. Information stored on storage cells that are connected to the word line are read while the first read level is applied to the bit lines (e.g., sense amplifiers 250 sense ON cell currents from the storage cells on the bit lines). As described above, a read voltage threshold may be used that is higher than the stored charge/voltage levels in the storage cells, so that the storage cells should each sink current and become conductive, providing their associated ON cell currents on the bit lines. Any storage cells with ON cell currents that are below a threshold, undetectable, or the like while the first bit line voltage is applied to the bit line may be considered failed storage cells (e.g., having low ON cell currents).

Such failed storage cells may be storage cells that operate properly with a second read level (e.g., a second, adjusted bit line voltage of about 0.75 volts, or the like). The second read level may be higher than the first read level (e.g., a higher bit line voltage that may increase the low ON cell currents of the failed storage cells) in some embodiments. In other embodiments, depending on an architecture of the storage cells or the like, the second read level may be lower than the first read level (e.g., a lower voltage or other bit line input).

Failed storage cells may be storage cells that have cell currents that fail to satisfy a sensing or detection threshold during a read. For example, storage cells that operate properly with a high bit line voltage may fail to satisfy a threshold during a read if a low, default, and/or nominal bit line voltage is supplied to such storage cells. In other words, by supplying a low voltage bias to bit lines of storage cells that operate properly with a higher voltage bias, the storage cells may not have a sufficient ON current to be identified by the sense amplifiers 250. Accordingly, the storage cells may have ON currents that fail to satisfy a threshold during a read, resulting in potential data errors.

In certain embodiments, the threshold comparison module 604 determines whether a number of failed storage cells exceeds a threshold. For example, a threshold may be any suitable value, such as 1%, 2%, 5%, 10%, 20%, 30%, 40%, 50%, 75%, or the like of the storage cells in a set of storage cells (e.g., storage cells of a word line). Thus, the threshold comparison module 604 may determine if the number of failed storage cells is less than the predetermined threshold, equal to the predetermined threshold, greater than the predetermined threshold, and/or otherwise fails to satisfy the threshold. The threshold may be predetermined and/or modified as the storage cells are used. The threshold comparison module 604 may use any comparison circuitry or software to determine whether the number of failed storage cells exceeds the predetermined threshold. In certain embodiments, the predetermined threshold may be determined and/or stored with the storage cells during manufacturing and/or testing. In other embodiments, the predetermined threshold may be a fixed value. In some embodiments, the predetermined threshold may be a selectable value that may be configured by an operator, a processor, a controller, and/or by another module or device.

In various embodiments, the bit line level selection module 606 selects a read level based on whether the number of failed storage cells exceeds the predetermined threshold. In one embodiment, the bit line level selection module 606 selects a first bit line level for bit lines of a plurality of bit lines that do not exceed the predetermined threshold and selects a second bit line level for bit lines of the plurality of bit lines that exceed the predetermined threshold. In such an embodiment, the first bit line input may be a bit line input used during a first read (e.g., a dummy read). For example, in one embodiment, the bit line level selection module 606 sets a latch or register for all failed storage cells to control a voltage applied to the failed storage cells to a higher bit line voltage than a bit line voltage applied to storage cells that did not fail, or the like.

Figure 7:
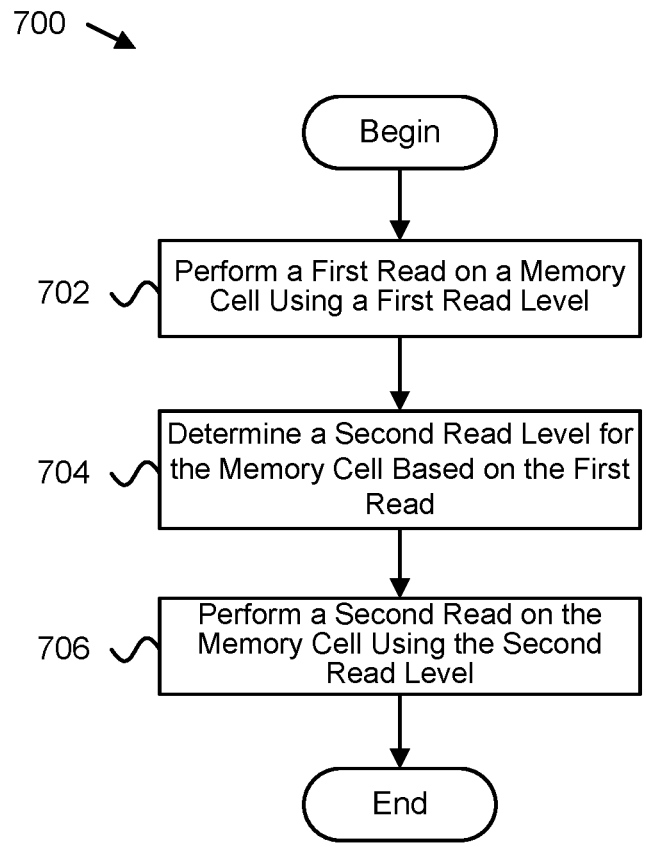
FIG. 7 is a schematic flow chart diagram illustrating one embodiment of a method for read level determination.

FIG. 7 depicts one embodiment of a method 700 for read level determination. The method 700 may be performed at any point in time, such as at predetermined intervals for calibrating and/or recalibrating a block of non-volatile storage cells, in response to an uncorrectable bit error, for each read operation, or the like. For example, the method 700 may be performed at a predetermined interval of every 200 program/erase cycles, or the like. The method 700 begins and the nominal read module 502 performs 702 a first read on a memory cell using a first read level. In certain embodiments, the nominal read module 502 performs 702 a first read on multiple memory cells (e.g., a word line). The read adjustment determination module 504 determines 704 a second read level for at least a portion of the memory cell based on the first read. In some embodiments, the read adjustment determination module 504 determines 704 a second read level for multiple memory cells and/or for multiple bit lines.

In certain embodiments, the read adjustment determination module 504 determines a number of failed storage cells of a set of storage cells with cell currents that fail to satisfy a sensing or detection threshold during the first read, determines whether the number of failed storage cells exceeds a predetermined threshold, and selects the second read level based on whether the number of failed storage cells exceeds the predetermined threshold. In such embodiments, the second read level may be greater than the first read level if the number of failed storage cells exceeds the predetermined threshold. In some embodiments, selecting the second read level includes selecting one read level for bit lines that do not exceed the predetermined threshold and selecting another read level for bit lines that exceed the predetermined threshold.

The adjusted read module 506 performs 706 a second read on the memory cell using the second read level, and the method 700 ends. In some embodiments, the adjusted read module 506 performs 706 a second read on multiple memory cells using a second read level for each bit line of multiple bit lines. In certain embodiments, the second read level is the same as the first read level.

Figure 8:
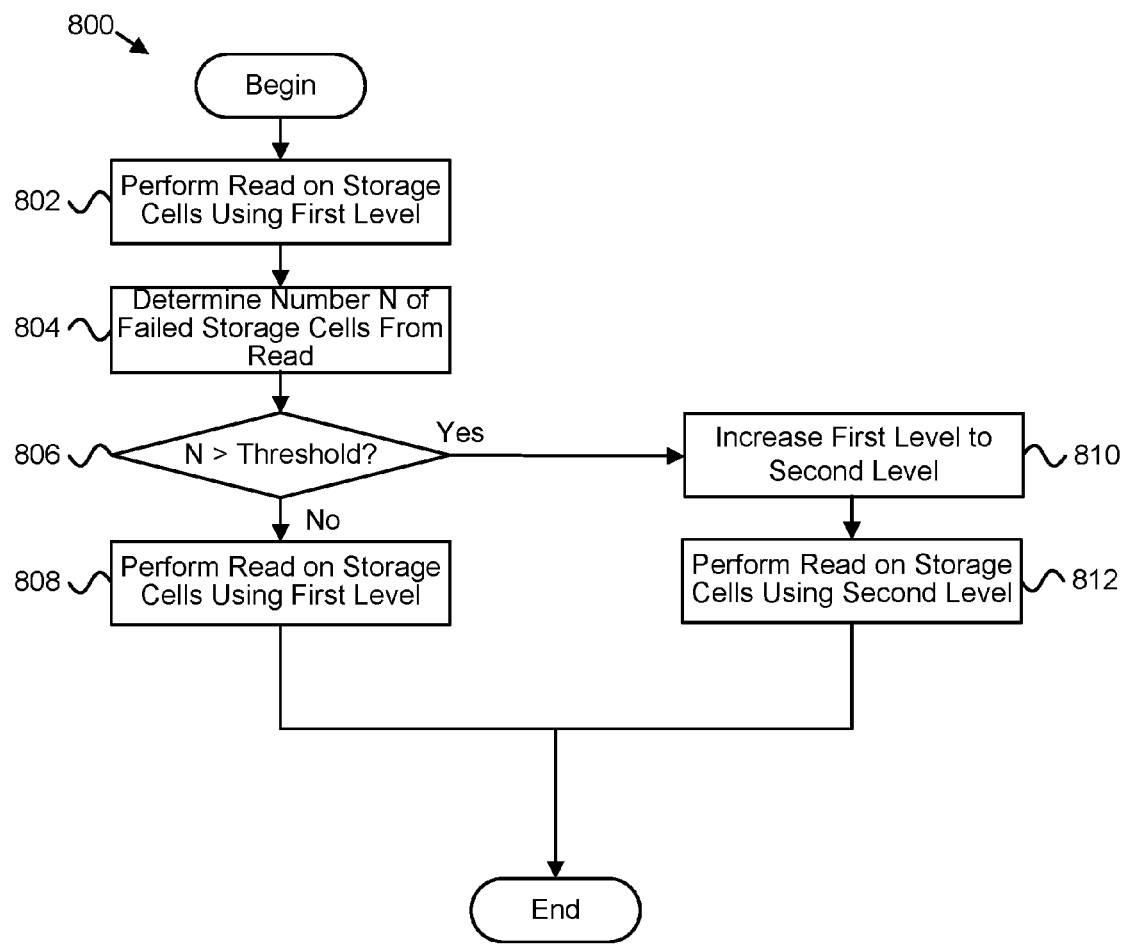
FIG. 8 is a schematic flow chart diagram illustrating a further embodiment of a method for read level determination.

FIG. 8 is a schematic flow chart diagram illustrating a further embodiment of a method 800 for read level determination. The method 800 begins, and the nominal read module 502 performs 802 a read on storage cells using a first read level. The read adjustment determination module 504 determines 804 a number N of failed storage cells from the read.

The read adjustment determination module 504 determines 806 whether N is greater than a predetermined threshold. If N is less than the predetermined threshold, the adjusted read module 506 performs 808 a read on the storage cells using the first read level, then the method 800 ends. If N is greater than the predetermined threshold, the read adjustment determination module 504 increases 810 the first read level to a second read level. Then, the adjusted read module 506 performs 812 a read on the storage cells using the second read level, and the method 800 ends. In other embodiments, the adjusted read module 506 may perform 812 a read on the storage cells using multiple different read levels (e.g., a first bit line voltage for cells with ON currents above a threshold and a second bit line voltage for cells with ON currents below a threshold, or the like).

Figures 9A, 9B:
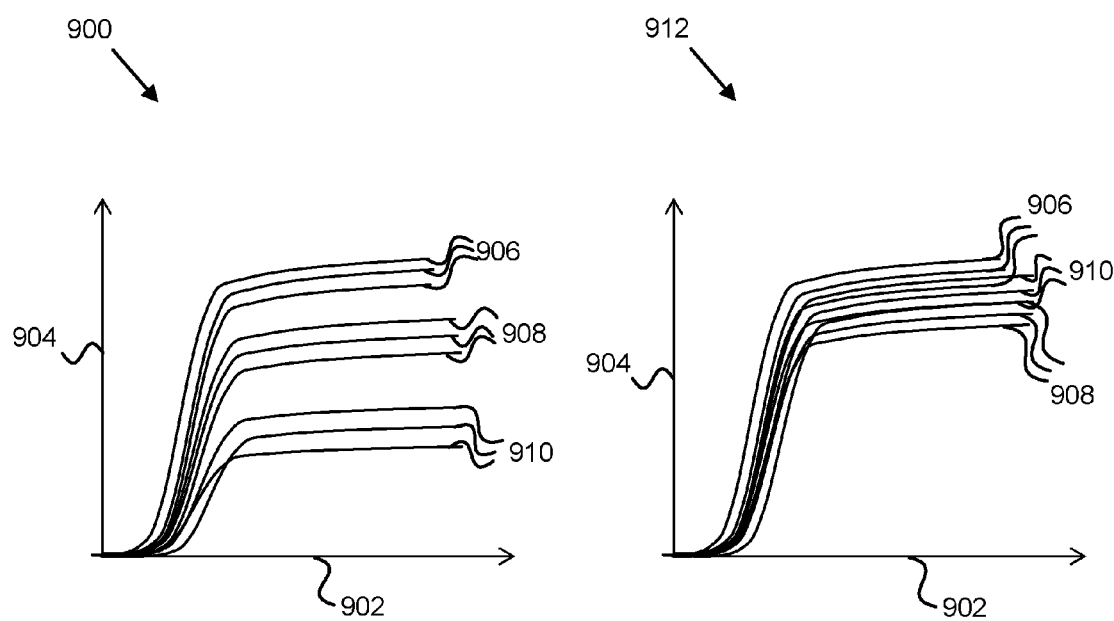
FIG. 9A is a graph illustrating one embodiment of ON current variation in a 3D memory array.
FIG. 9B is a graph illustrating one embodiment of adjusted voltage application in a 3D memory array.

FIG. 9A is a graph 900 illustrating one embodiment of ON current variation in a 3D memory array. The graph 900 illustrates current 904 versus voltage 902 for various storage cells. A first set of storage cells 906 has a higher ON (e.g., saturation) current than a second set of storage cells 908. Moreover, the second set of storage cells 908 has a higher ON current than a third set of storage cells 910. In certain embodiments, the first set of storage cells 906 may be considered as having a high ON current, the second set of storage cells 908 may be considered as having an intermediate ON current, and the third set of storage cells 910 may be considered as having a low ON current.

FIG. 9B is a graph 912 illustrating one embodiment of adjusted voltage application in a 3D memory array. In certain embodiments, the voltage applied to read the first set of storage cells 906 may remain the same as in FIG. 9A. Moreover, the voltage applied to read the second set of storage cells 908 may be increased to a greater value than the voltage applied to read the first set of storage cells 906 to decrease the ON current variation. Furthermore, the voltage applied to read the third set of storage cells 910 may be increased to a greater value than the adjusted voltage applied to read the second set of storage cells 908 to decrease the ON current variation. The result, as illustrated in the graph 912, is that the first, second, and third sets of storage cells 906, 908, and 910 have a reduced ON current variation. In certain embodiments, fewer or more than three sets of storage cells may be grouped together, accordingly fewer or more than three read voltages may be used.

Figure 10A:
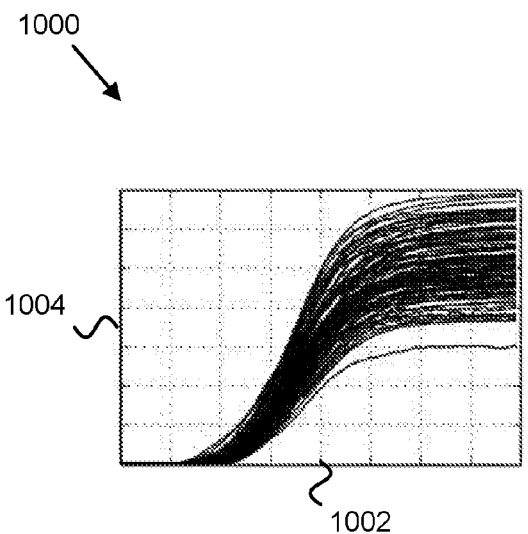
FIG. 10A is a graph illustrating one embodiment of ON current variation of a set of memory cells on a word line.
Figure 10B:
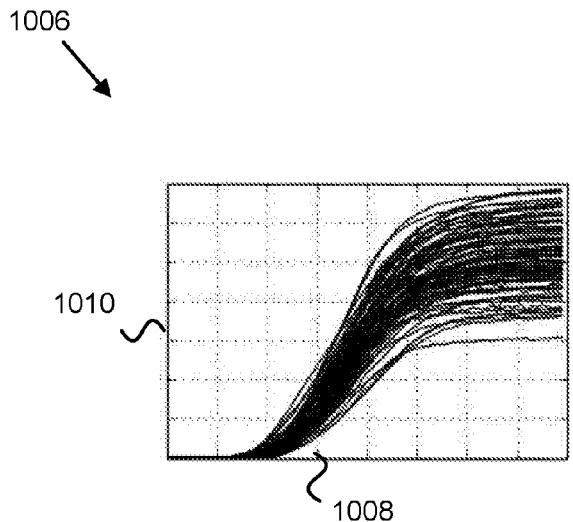
FIG. 10B is a graph illustrating one embodiment of ON current variation of a set of memory cells of a different word line.
Figure 10C:
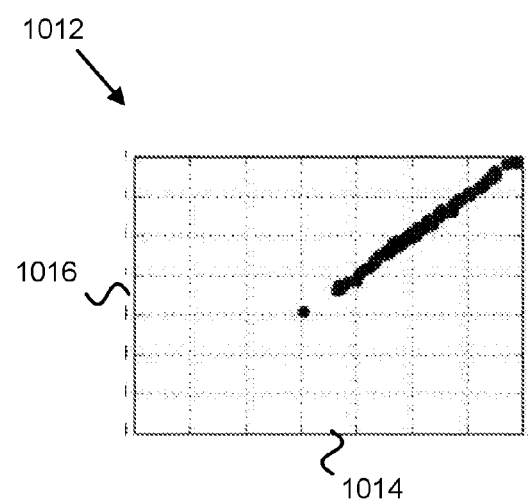
FIG. 10C is a graph illustrating one embodiment of ON current correlation between memory cells on different word lines.

FIG. 10A is a graph 1000 illustrating ON current variation between memory holes (i.e., NAND strings). Specifically, current 1004 versus voltage 1002 is illustrated for a number of storage cells on a first word line for a set of memory holes. FIG. 10B is another graph 1006 illustrating ON current variation between memory holes. Specifically, current 1010 versus voltage 1008 is illustrated for a number of storage cells of a second word line for the same set of memory holes. FIG. 10C is a graph 1012 illustrating an embodiment of ON current correlation of memory cells on word lines sharing the same set of memory holes. The graph 1012 illustrates the correlation between the ON current of the memory cells on a first word line 1014 and the ON current of the memory cells on a second word line 1016 sharing the same set of memory holes. As illustrated there is a strong correlation between memory cells of the first word line 1014 and the second word line 1016 sharing the same memory holes. In some embodiments, all memory cells on word lines sharing the same set of memory holes may have approximately the same ON current.

Figure 10D:
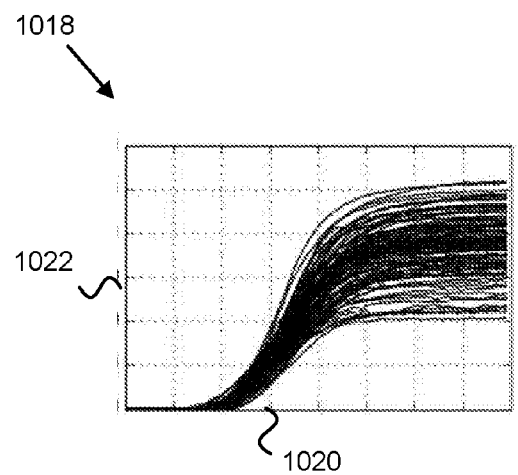
FIG. 10D is a graph illustrating one embodiment of ON current variation of a set of memory cells on a word line after a number of program/erase cycles.
Figure 10E:
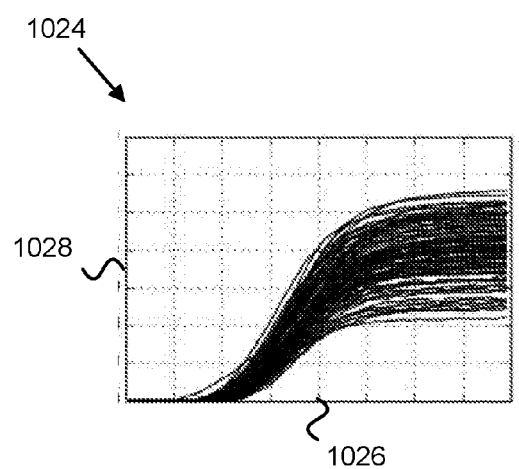
FIG. 10E is a graph illustrating one embodiment of ON current variation of a set of memory cells.
Figure 10F:
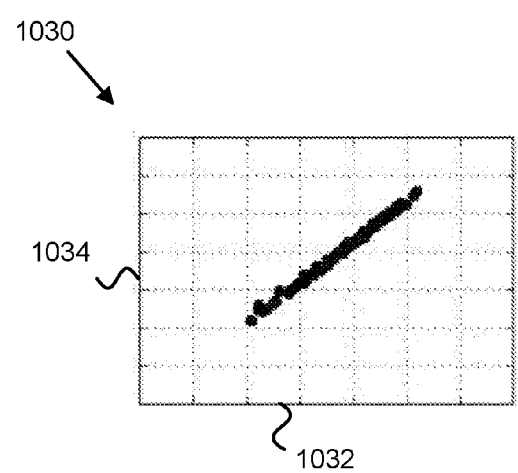
FIG. 10F is a graph illustrating one embodiment of ON current correlation between memory cells on different word lines.

FIG. 10D is a graph 1018 illustrating ON current variation between memory holes after a large number of program/erase cycles. Specifically, current 1022 versus voltage 1020 is illustrated for a number of storage cells on a first word line for a set of memory holes. FIG. 10E is another graph 1024 illustrating ON current variation between memory holes. Specifically, current 1028 versus voltage 1026 is illustrated for a number of storage cells of a second word line for the same set of memory holes. FIG. 10F is a graph 1030 illustrating an embodiment of ON current correlation of memory cells on word lines sharing the same set of memory holes after a large number of program/erase cycles. The graph 1030 illustrates the correlation between the ON current of the memory cells on a first word line 1032 and the ON current of the memory cells on a second word line 1034 sharing the same set of memory holes. As illustrated there is a strong correlation between memory cells of the first word line 1032 and the second word line 1034 sharing the same memory holes even after a large number of program/erase cycles. In some embodiments, all memory cells on word lines sharing the same set of memory holes may have approximately the same ON current.

Figure 10G:
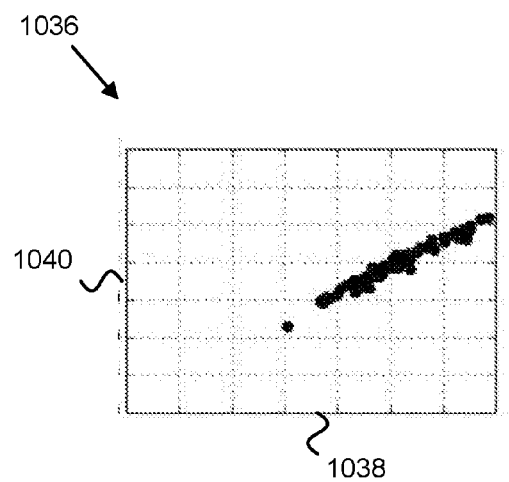
FIG. 10G is a graph illustrating one embodiment of ON current correlation between memory cells on different word lines after a number of program/erase cycles.

FIG. 10G is a graph 1036 illustrating an embodiment of ON current correlation of memory cells on word lines sharing the same set of memory holes before and after a large number of program/erase cycling. The graph 1036 illustrates the correlation between the ON current of memory cells on a first word line 1038 before a large number of program/erase cycles and the ON current of the same first word line 1040 after the large number of program/erase cycles. As illustrated, there is a strong correlation between the ON currents before program/erase cycling 1038 and after program/erase cycling 1040 for the same set of memory holes. In some embodiments, all memory cells on word lines sharing the same set of memory holes may have approximately the same ON current even after a large number of program/erase cycling.

FIG. 11 is a graph 1100 illustrating one embodiment of an optimum bit line voltage 1104 to be applied during a second read as a function of the ON cell current 1102 as obtained during a first read. As illustrated by a curve 1106, as the ON cell current 1102 decreases, the bit line voltage 1104 used to compensate for the lower ON cell current 1102 increases. Conversely, as the ON cell current 1102 increases, the bit line voltage 1104 used to compensate for the higher ON cell current 1102 decreases.

FIG. 12A is schematic block diagram illustrating one embodiment of a memory hole 1200. The memory hole 1200 has a low ON current 1202. Accordingly, a high bit line voltage may be supplied to the memory hole 1200 to compensate for the low ON current 1202 similar to the depiction in FIG. 9B. FIG. 12B is schematic block diagram illustrating another embodiment of a memory hole 1210. The memory hole 1210 has a high ON current 1212. Accordingly, a low bit line voltage may be supplied to the memory hole 1210 to compensate for the high ON current 1212.

A means for performing a first read on cells of a non-volatile memory medium (e.g., to determine cell currents of the cells), in various embodiments, may include a read level determination component 150, a nominal read module 502, a non-volatile storage device interface 139, a non-volatile memory medium controller 126, a storage client 116, a database system 116a, a host computing device 110, a bus 127, a network 115, a device driver, a controller (e.g., a device driver, a state machine, an FPGA, an ASIC, or the like) executing on a host computing device 110, a processor 111, other logic hardware, and/or other executable code stored on a computer readable storage medium. Other embodiments may include similar or equivalent means for performing a first read on cells of a non-volatile memory medium.

A means for determining bit line voltages for a plurality of bit lines corresponding to cells based on a first read and/or based on cell currents determined for the cells, in various embodiments, may include a read level determination component 150, a read adjustment determination module 504, a non-volatile storage device interface 139, a non-volatile memory medium controller 126, a failure determination module 602, a threshold comparison module 604, a bit line level selection module 606, a storage client 116, a database system 116a, a host computing device 110, a bus 127, a network 115, a device driver, a controller (e.g., a device driver, a state machine, an FPGA, an ASIC, or the like) executing on a host computing device 110, a processor 111, other logic hardware, and/or other executable code stored on a computer readable storage medium. Other embodiments may include similar or equivalent means for determining bit line voltages for a plurality of bit lines corresponding to cells.

A means for performing a second read on cells using determined bit line voltages for a plurality of bit lines, in various embodiments, may include a read level determination component 150, an adjusted read module 506, a non-volatile storage device interface 139, a non-volatile memory medium controller 126, a storage client 116, a database system 116a, a host computing device 110, a bus 127, a network 115, a device driver, a controller (e.g., a device driver, a state machine, an FPGA, an ASIC, or the like) executing on a host computing device 110, a processor 111, other logic hardware, and/or other executable code stored on a computer readable storage medium. Other embodiments may include similar or equivalent means for performing a second read on cells using determined bit line voltages for a plurality of bit lines.

A means for determining a number of failed cells for each bit line with cell currents below a current threshold during a first read, in various embodiments, may include a read level determination component 150, a read adjustment determination module 504, a non-volatile storage device interface 139, a non-volatile memory medium controller 126, a failure determination module 602, a threshold comparison module 604, a bit line level selection module 606, a storage client 116, a database system 116a, a host computing device 110, a bus 127, a network 115, a device driver, a controller (e.g., a device driver, a state machine, an FPGA, an ASIC, or the like) executing on a host computing device 110, a processor 111, other logic hardware, and/or other executable code stored on a computer readable storage medium. Other embodiments may include similar or equivalent means for determining a number of failed cells for each bit line with cell currents below a current threshold during a first read.

In some embodiments, the means for determining the bit line voltages selects the bit line voltages based on whether the number of failed cells for each bit line satisfies a predetermined threshold. In various embodiments, the means for determining the bit line voltages selects a first bit line voltage for bit lines of the plurality of bit lines that do not satisfy the predetermined threshold and selects a second bit line voltage for bit lines of the plurality of bit lines that satisfy the predetermined threshold. In such embodiments, the second bit line voltage may be greater than the first bit line voltage.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a block of non-volatile storage cells comprising a plurality of bit lines; and
   a controller for the block, the controller configured to:
      perform a first read on a set of storage cells using a first read level for the bit lines;
      determine a second read level for at least a portion of the bit lines based at least partially on cell currents detected during the first read; and
      perform a second read on the set of storage cells using the second read level for at least a portion of the bit lines.

2. The apparatus of claim 1, wherein the controller is configured to:
   determine which storage cells of the set of storage cells have cell currents on the bit lines that fail to satisfy a sensing threshold during the first read; and
   use the second read level for bit lines of the determined storage cells during the second read.

3. The apparatus of claim 2, wherein the second read level is greater than the first read level such that the cell currents for at least a portion of the determined storage cells increases during the second read.

4. The apparatus of claim 1, wherein the controller comprises an error correcting code (ECC) decoder configured to use data from the first read to correct one or more data errors in data from the second read.

5. The apparatus of claim 1, wherein hardware of a non-volatile storage device comprises the block of non-volatile storage cells and the controller.

6. The apparatus of claim 5, wherein the hardware of the non-volatile storage device comprises a storage controller in communication with a plurality of semiconductor chips of non-volatile storage, one of the semiconductor chips comprising the block of non-volatile storage cells.

7. The apparatus of claim 5, wherein the hardware of the non-volatile storage device comprises a state machine on the same semiconductor chip as the block of non-volatile storage cells.

8. The apparatus of claim 1, wherein the controller comprises a device driver for a non-volatile storage device comprising the block of non-volatile storage cells, the device driver comprising a non-transitory computer readable storage medium storing executable code of the controller.

9. A method comprising:
   performing a dummy read on a memory cell;
   determining a bit line input for a bit line of the memory cell based at least partially on cell currents detected during the dummy read; and
   performing a read on the memory cell using the determined bit line input.

10. The method of claim 9, wherein multiple dummy reads are performed on a plurality of word lines comprising a plurality of memory cells, determining the bit line input comprises determining bit line inputs for a plurality of bit lines corresponding to the plurality of word lines, and performing the read of the memory cell comprises performing a read on one of the word lines corresponding to the memory cell using the different determined bit line inputs for the plurality of bit lines.

11. The method of claim 10, wherein determining the bit line inputs for the plurality of bit lines comprises:
   determining a number of failed memory cells for each bit line of the plurality of word lines based on the multiple dummy reads;
   determining whether the number of failed memory cells for each bit line exceeds a predetermined threshold; and
   using the determined bit line input during the read for bit lines where the number of failed memory cells for the bit line exceeds the predetermined threshold.

12. The method of claim 11, further comprising:
   selecting a first bit line input for bit lines of the plurality of bit lines with a number of failed memory cells that do not exceed the predetermined threshold; and
   selecting a second bit line input for bit lines of the plurality of bit lines with a number of failed memory cells that do exceed the predetermined threshold.

13. The method of claim 12, wherein the first bit line input comprises a bit line input used during the dummy read.

14. The method of claim 9, wherein the dummy read is performed during a manufacturing and testing process for the memory cell.

15. The method of claim 9, wherein the determined bit line input for the bit line is stored in a non-volatile memory medium comprising the memory cell.

16. The method of claim 9, wherein performing the dummy read on the memory cell comprises performing the dummy read using a first bit line input and performing the read on the memory cell comprises performing the read using a second bit line input.

17. The method of claim 16, wherein the first bit line input is less than the second bit line input in response to a cell current for the memory cell during the dummy read failing to satisfy a sensing threshold.

18. The method of claim 9, wherein the dummy read is performed before the read of the memory cell.

19. An apparatus comprising:
   means for performing a first read on cells of a non-volatile memory medium to determine cell currents used to read the cells;
   means for determining bit line voltages for a plurality of bit lines corresponding to the cells based on the determined cell currents; and
   means for performing a second read on the cells using the determined bit line voltages for the plurality of bit lines.

20. The apparatus of claim 19, wherein the means for determining the bit line voltages selects a first bit line voltage for bit lines of the plurality of bit lines with cell currents that do not satisfy a predetermined threshold and selects a second bit line voltage for bit lines of the plurality of bit lines with cell currents that satisfy the predetermined threshold, wherein the second bit line voltage is greater than the first bit line voltage.

* * * * *